United States Patent [19]

Takata et al.

[11] Patent Number: 4,839,539
[45] Date of Patent: Jun. 13, 1989

[54] PARTIALLY ENABLED PROGRAMMABLE LOGIC DEVICE

[75] Inventors: Akira Takata, Amagasaki; Takeo Obata, Osaka, both of Japan

[73] Assignee: Ricoh Company, Ltd., Tokyo, Japan

[21] Appl. No.: 93,976

[22] Filed: Sep. 8, 1987

[30] Foreign Application Priority Data

Sep. 11, 1986 [JP] Japan .................. 61-215552

[51] Int. Cl.[4] .......................................... H03K 19/177
[52] U.S. Cl. .................. 307/465; 307/469; 364/716
[58] Field of Search ........... 307/465, 468, 469, 296 R; 364/707, 716

[56] References Cited

U.S. PATENT DOCUMENTS

| | | | |
|---|---|---|---|
| 4,032,894 | 6/1977 | Williams | 307/466 X |
| 4,567,385 | 1/1986 | Falater et al. | 307/469 X |
| 4,645,953 | 2/1987 | Wong | 307/465 X |
| 4,691,123 | 9/1987 | Hashimoto | 307/296 R |
| 4,761,570 | 8/1988 | Williams | 307/465 |

OTHER PUBLICATIONS

Flaker et al., "Programmed Power Proportioning for PLA's", IBM T.D.B., vol. 18, No. 4, Sep. 1975, pp. 1047-1048.

*Primary Examiner*—David Hudspeth
*Attorney, Agent, or Firm*—Cooper & Dunham

[57] ABSTRACT

A programmable logic device include an AND gate array and an OR gate array, at least one of which is programmable by the user. The AND gate array includes a plurality of input lines, a plurality of product term lines which cross said plurality of input lines, and a plurality of programmable elements located at the intersections between the input and product term lines. An activation control circuit is also provided for activating at least one of the product term lines while keeping those product term lines which are not used for programming deactivated. With this structure, the waste of power can be minimized.

9 Claims, 5 Drawing Sheets

| Fig.1A | Fig.1B |

Fig. IB
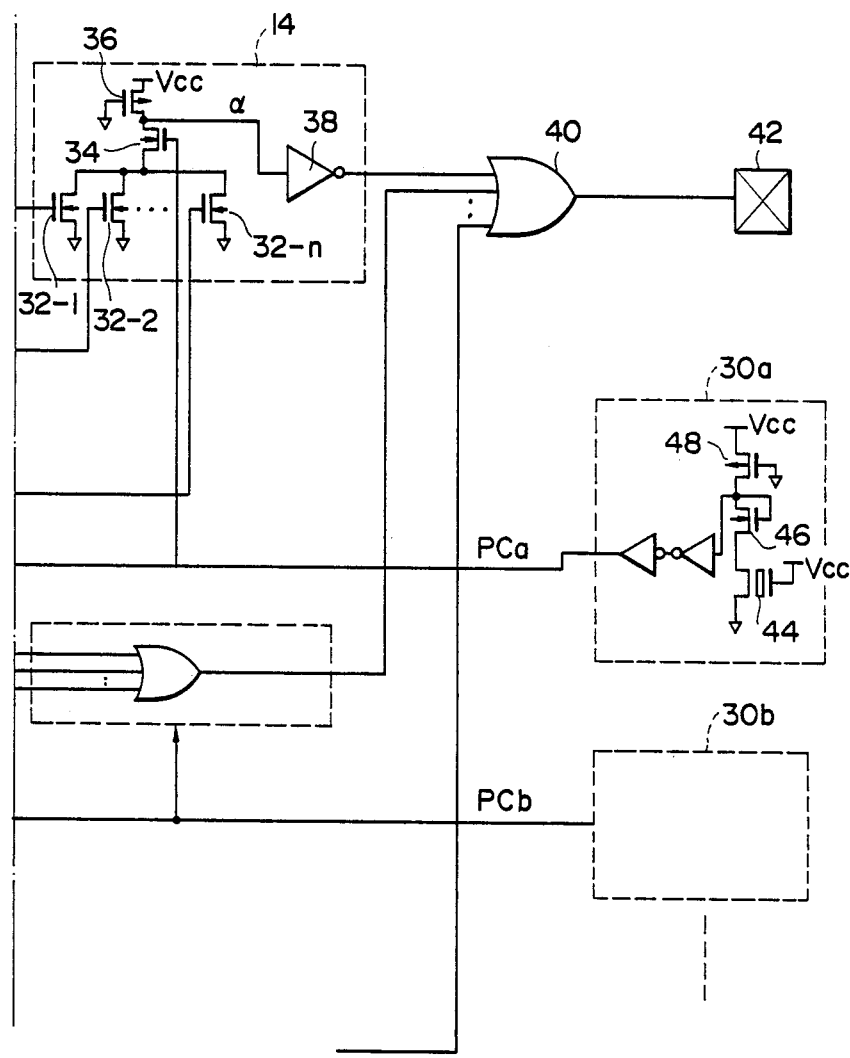

4,839,539

PARTIALLY ENABLED PROGRAMMABLE LOGIC DEVICE

BACKGROUND OF THE INVENTION

1. Field of the Invention

This invention generally relates to a semiconductor logic device, and, in particular, to a programmable logic device including AND plane and an OR plane, at least one of which is programmable and which may be partially enabled or disabled selectively.

2. Description of the Prior Art

A programmable logic device is well known in the art, and it typically includes an AND gate array (AND plane) and an OR gate array (OR plane), at least one of which is programmable by the user. In one form, a programmable logic device (PLD) includes an AND plane and an OR plane, both of which are programmable by the user. In another form, a programmable logic device includes a programmable AND plane and a fixed and thus non-programmable OR plane. This latter form of PLD is also called a programmable array logic or PAL.

In either form of PLD, an AND plane includes a plurality of input lines extending in a first direction in parallel and a plurality of product term lines extending in a second direction, which is different from the first direction, in parallel. And, a programmable element, such as a programmable memory transistor, is provided at each intersection between the input and product term lines. For example, in the case of a programmable logic device having a fixed OR plane, the number of product term lines to be connected to one OR gate is previously determined for each product and it cannot be changed by the user.

In a PLD, it is rather rare to use all of the product term lines and some of the product term lines are usually left unused depending on the kind of a logic desired to be programmed by the user. However, in the prior art PLD, irrespective of whether all of the product term lines are used or not, all of the product term lines are kept enabled or in an operative state. This is disadvantageous because additional power is consumed by these product term lines which are not used. For example, if there are sixteen product term lines connected to a single OR gate and only four of them are used, three quarters of the total power consumed by the product term lines connected to this OR gate are wasted. In general, the use rate of the product term lines in a PLD having a fixed OR plane is in a range from 30 to 40% on the average. It is thus clear that a significant amount of power is wasted in the prior art PLD.

SUMMARY OF THE INVENTION

In accordance with the present invention, there is provided a programmable logic device including an AND plane and an OR plane. The AND plane includes a plurality of input lines extending in a first direction and a plurality of product term lines extending in a second direction which is different from the first direction. Also provided in the programmable logic device is a plurality of programmable memory elements each of which is provided at a corresponding one of the crossover points between the input and product term lines. Also provided is means for selectively activating the plurality of product term lines. That is, in accordance with the present invention, the number of the product term lines which are not used and which are activated or enabled is minimized. Since it is known empirically that some of the product term lines are left unused after programming, power will be wasted if all of the product term lines are activated. Thus, in accordance with the present invention, the product term lines are selectively activated so as to minimize the waste of power.

It is therefore a primary object of the present invention to obviate the disadvantages of the prior art as described above and to provide an improved programmable logic device.

Another object of the present invention is to provide an improved programmable logic device whose product term lines are activated selectively to thereby minimize the waste of power.

A further object of the present invention is to provide an improved programmable logic device in which power is supplied to only selected ones of its product term lines.

A still further object of the present invention is to provide an improved programmable logic device low and optimum in power consumption and suitable for large scale implementation.

Other objects, advantages and novel features of the present invention will become apparent from the following detailed description of the invention when considered in conjunction with the accompanying drawings.

BRIEF DESCRIPTION OF THE DRAWINGS

FIG. 1 is an illustration showing how to combine FIGS. 1A and 1B;

FIGS. 1A and 1B, when combined as illustrated in FIG. 1, illustrate a programmable logic device having a programmable AND array and a fixed OR array constructed in accordance with one embodiment of the present invention;

DESCRIPTION OF THE PREFERRED EMBODIMENTS

Figures 1, 1A:
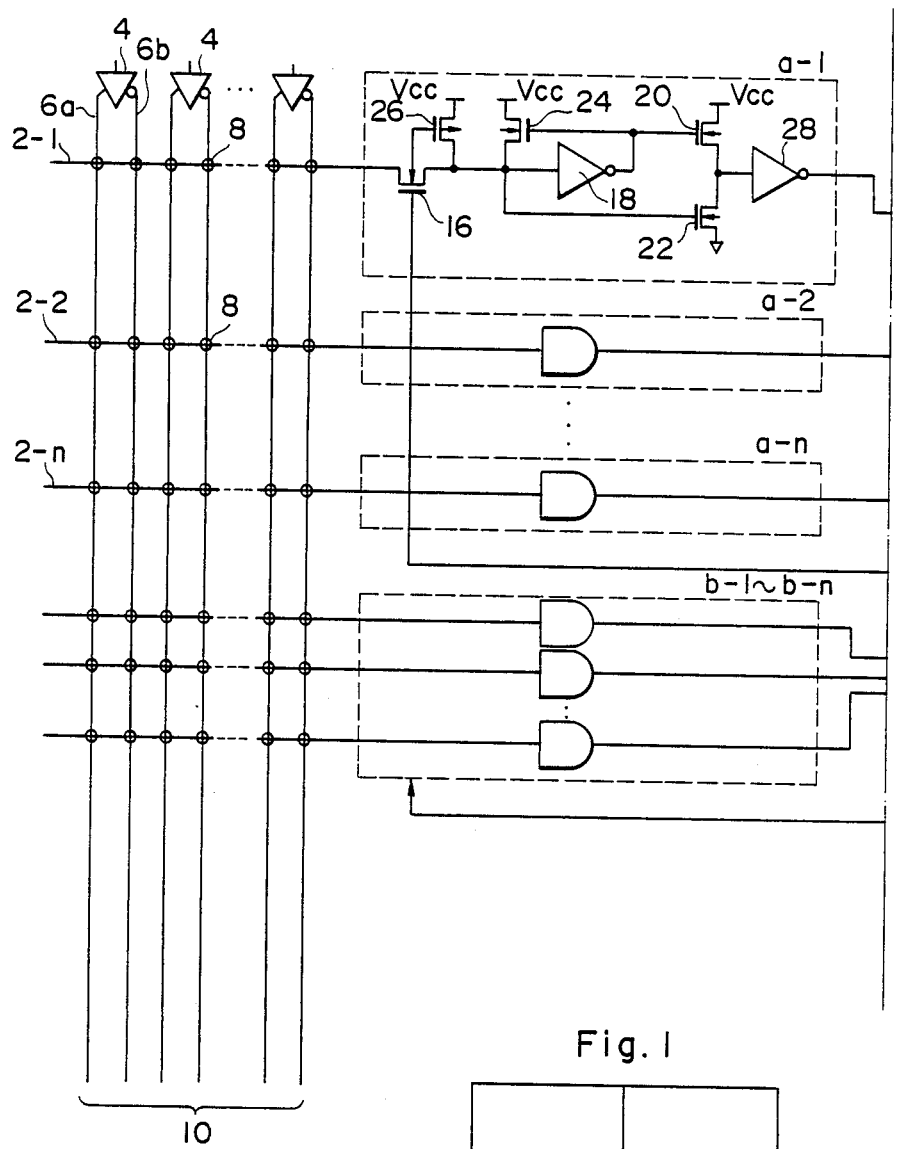
Figure 2:
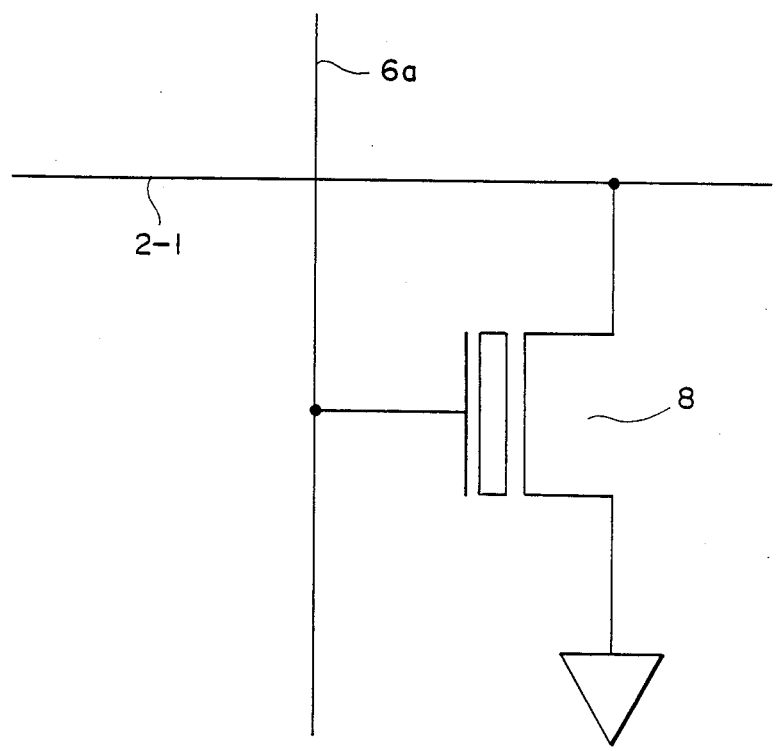
FIG. 2 is a schematic illustration showing a FAMOS transistor suitable for use as a memory element in the structure shown in FIGS. 1A and 1B.

Referring now to FIGS. 1A and 1B combined as indicated in FIG. 1, there is schematically shown a programmable logic device constructed in accordance with one embodiment of the present invention. As shown, the illustrated programmable logic device includes an AND gate array 10, which is programmable, and an OR gate array 40, which is not programmable. The AND gate array 10 includes a plurality of product term lines 2-1, 2-2, 2-n, ... extending horizontally and a plurality of input lines 6a, 6b, ... extending vertically. At each intersection between the product term and input lines is provided a programmable or reprogrammable element, such as a FAMOS transistor shown in FIG. 2. The input lines are paired and each pair of input lines is connected to a corresponding one of input buffers 4 such that a input signal input to the input buffer 4 appears as it is in one of the paired input lines and an inverted signal of the input signal appears in the other input line.

The product term line 2-1 is coupled to an AND sense circuit a-1 and also to an OR circuit 14. Described more in detail, the product term line 2-1 is connected to an input terminal of a CMOS inverter 18 through an NMOS transistor 16 of the AND sense circuit a-1. The input terminal of the CMOS inverter 18 is connected to the gate of an NMOS transistor 22 which is connected in series with another NMOS transistor 20 between power supply voltage $V_{cc}$ and ground. In addition, the input terminal of the inverter 18 is also connected to power supply voltage $V_{cc}$ through an NMOS transistor 24 which has its gate connected to the output terminal of the inverter 18. Besides, the product term line 2-1 is also connected to a PMOS transistor 26, which serves as a pull-up transistor, through the NMOS transistor 16. On the other hand, a node between the NMOS transistors 20 and 22 is connected to the input terminal of the OR circuit 14 through a CMOS inverter 28.

It is to be noted that the AND sense circuit a-1 has a function as a sense circuit and also a function as a bias circuit for supplying power supply voltage $V_{cc}$ to the product term line 2-1 by the NMOS transistor 24. Each of the MOS transistors 16 and 26 has its gate connected to a power supply control circuit 30a, which selects which of the product term lines to be selected for operation. It should also be noted that the AND sense circuit a-1 is provided for the product term line 2-1; however, AND sense circuits a-2, of the identical structure are provided for the remaining product term lines 2-2, ..., 2-n, ..., respectively.

The OR circuit 14 includes a plurality of input NMOS transistors 32-1 through 32-n which have their drains commonly connected and their sources connected to ground. The plurality of NMOS transistors 32-1 through 32-n are connected to power supply voltage $V_{cc}$ through an NMOS transistor 34 and a load PMOS transistor 36. A node between the MOS transistors 34 and 36 is connected to the input terminal of the OR circuit 40 through a CMOS inverter 38. Each of the plurality of input NMOS transistors 32-1 through 32-n has its gate connected to the corresponding one of the output terminals of the AND sense circuits a-1 through a-n which in turn are connected to the product term lines 2-1 through 2-n, respectively. In the illustrated embodiment, n number of product term lines 2-1 through 2-n are connected to the single OR circuit 14 via respective AND sense circuits a-1 through a-n. Thus, these n number of product term lines 2-1 through 2-n define one group, which is selectively activated or deactivated.

The OR circuit 14 also includes an NMOS transistor 34 which is connected to the common node of the plurality of input transistors 32-1 through 32-n and which has its gate connected to the output of the power supply voltage control circuit 30a. It is to be noted that the remaining product term lines are similarly grouped with each group having a number of product term lines. For each such group, an OR circuit identical in structure to the OR circuit 14 is provided and also a power supply voltage control circuit identical in structure to the power supply voltage control circuit 30a is provided. The output terminal of each of these OR circuits 14 is connected to the corresponding input terminal of the OR gate 40, which has its output terminal connected to a device output terminal 42.

The power supply voltage control circuit 30 includes a memory transistor 44, or FAMOS transistor in the illustrated embodiment, which is structurally the same as a memory transistor provided in the AND gate array 10. The memory transistor 44 has its control gate connected to power supply voltage $V_{cc}$, its source connected to ground and its drain connected to power supply voltage through a pair of serially connected MOS transistors 46 and 48. A node between these MOS transistors 46 and 48 is connected to the output terminal of the power supply voltage control circuit 30 via a pair of serially connected inverters.

In operation, when the power supply voltage control circuit 30a supplies a high level output "H", the NMOS transistors 16 and 34 are turned on and the PMOS transistor 26 is turned off, so that the group of product term lines 2-1 through 2-n connected to this power supply voltage control circuit 30a is activated or selected for operation. On the contrary, when the power supply voltage control circuit 30a supplies a low level output "L", the NMOS transistors 16 and 34 are turned off and the NMOS transistor 26 is turned on, so that the group of product term lines 2-1 through 2-n connected to this power supply voltage control circuit 30a is deactivated or deselected for operation. In the case when the power supply voltage control circuit 30a supplies a low level output "L", the NMOS transistor 16 is cut off to thereby cause the product term lines 2-1 through 2-n disconnected from the respective AND sense circuits a-1 through a-n, so that the supply of power supply voltage to the product term lines 2-1 through 2-n is discontinued. Besides, the pull-up transistor 26 is turned on, which causes the nodes inside of the AND sense circuits a-1 through a-n are fixed at $V_{cc}$ and $V_{ss}$(ground) levels, so that no power is consumed by the CMOS inverters 18 and 28.

On the other hand, when the power supply voltage control circuit 30a supplies a low level output "L", since the NMOS transistor 34 is also turned off, the power consumption in each of the OR circuits 14 becomes zero. And yet, a node alpha between the NMOS transistor 34 and the PMOS transistor 36 in each of the OR circuits 14 is pulled up to become high level "H", and, thus, the output of each OR circuit 14, which is an input to the next-stage OR circuit 40 and which is an inverted signal of the signal at node alpha, becomes low level "L". Thus, the product term lines 2-1 through 2-n of this group are logically maintained in the non-use condition. The same arguments hold true for the product term lines of the remaining groups.

It is to be noted that each of the product term lines may be individually controlled for activation. In such a case, only those product term lines which are used can be selected for operation with the rest maintained deactivated. This is the most efficient mode and the power consumption can be optimized most ideally. However, in such a case, many more power supply voltage control circuits must be provided, which then could occupy a significant percentage of the chip area. Thus, as a tradeoff, it is preferable to divide the total number of product term lines into a plurality of groups. e.g., four product term lines per group, and the supply of power supply voltage is controlled per group.

In addition, instead of providing a power supply voltage control circuit for each group of product term lines, use may be made of a combination logic of outputs of a single power supply voltage control circuit to control the activation of a plurality of groups of product term lines. In this case, the number of memory transistors required for the power supply voltage control circuit can be reduced. Since one memory transistor has two states, if n number of memory transistors are provided, $2^n$ number of states can be controlled.

Figure 3:
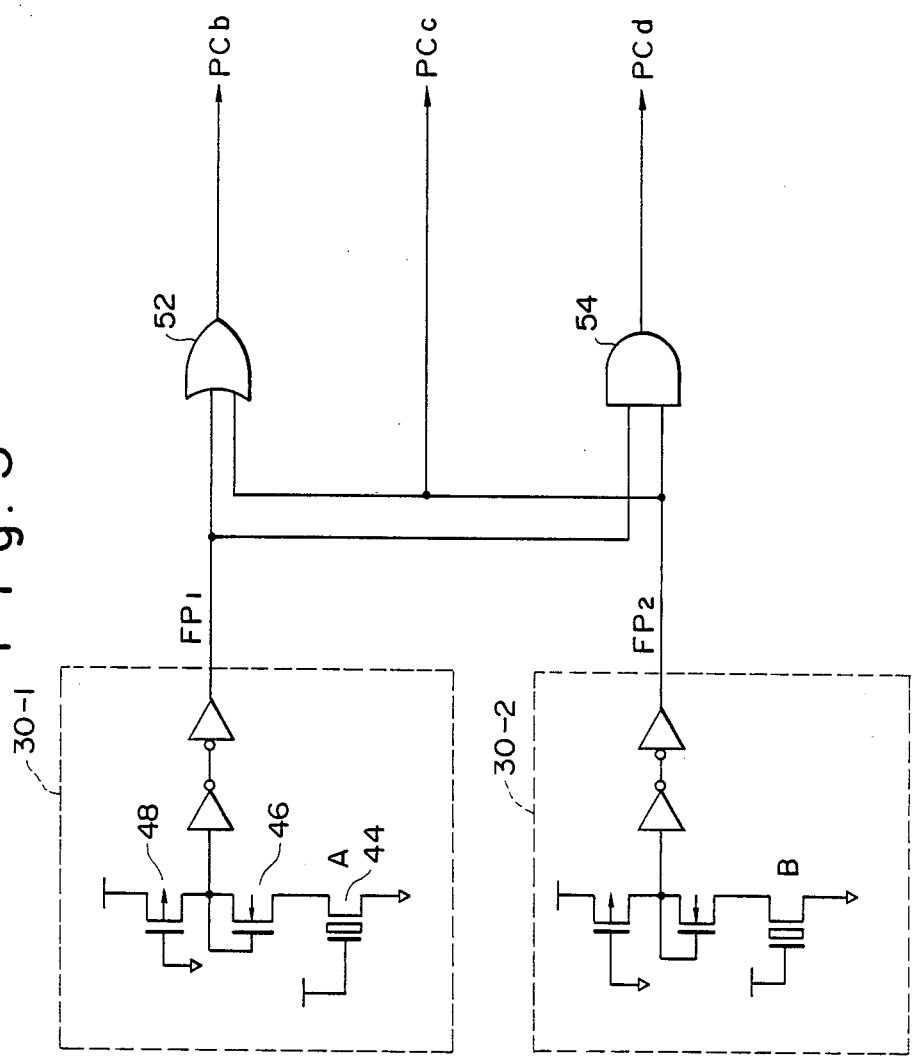
FIG. 3 is a circuit diagram showing a selecting circuit for selecting one or more of the plurality of product term lines for operation, constructed in accordance with another embodiment of the present invention.
Figure 4:
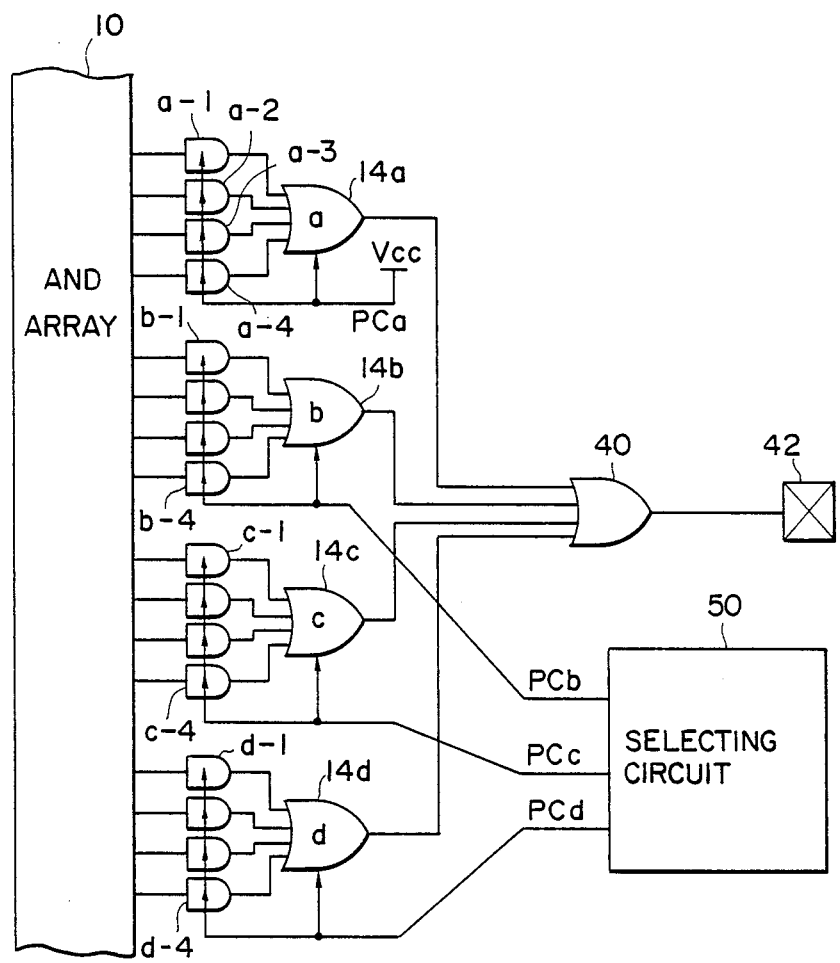
FIG. 4 is a schematic illustration showing in logic symbol a programmable logic device constructed in accordance with a further embodiment of the present invention utilizing the structure shown in FIG. 3.

An embodiment shown in FIGS. 3 and 4 is the case in which the total number of product term lines is divided into four groups, each of which has four product term lines, and the groups are selected for operation by two power supply voltage control circuits 30-1 and 30-2. In the present embodiment, sixteen product term lines are connected to an OR gate 40. As shown in FIG. 3, two power supply voltage control circuits 30-1 and 30-2 supply outputs FP$_1$ and FP$_2$, each of which is supplied to the corresponding input terminal of OR and AND gates 52 and 54. As a result, there are obtained three outputs PCb, PCc and PCd as combinations of these two outputs FP$_1$ and FP$_2$ through the OR gate 52 and the AND gate 54. It is to be noted that, in the illustrated embodiment, the group a including the top four product term lines receives the power supply voltage at all times, and only the other three groups b, c and d are selectively activated by the outputs PCb, PCc and PCd. It should also be noted that the block 50 in FIG. 4 corresponds to the structure shown in FIG. 3.

Depending on combinations of programmed states of memory transistors A and B in the power supply voltage control circuits 30-1 and 30-2 shown in FIG. 3, the number of product term lines to be activated can be selected between 4 and 16. This is tabulated below.

| | A | B | FP$_1$ | FP$_2$ | PCb | PCc | PCd | N.A.P.T.L. |
|---|---|---|---|---|---|---|---|---|
| State 1 | D | D | L | L | L | L | L | 4 |
| State 2 | P | D | H | L | H | L | L | 8 |
| State 3 | D | P | L | H | H | H | L | 12 |
| State 4 | P | P | H | H | H | H | H | 16 |

Here, D: deprogrammed condition;
P: programmed condition:
N.A.P.T.L.: No. of activated product term lines.

As described above, in accordance with the present invention, since those product term lines which are not used for programmed logic are maintained in the deactivated state, the waste of power is minimized. Thus, even if a large-scale PLD with an increased number of product term lines is desired, the overall power consumption can be maintained at a low level.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. A programmable logic device, comprising:
an AND plane, including a plurality of input lines, a plurality or product term lines, and a plurality of programmable elements each disposed at one of selected intersections between aid input and product term lines;
an OR plane operatively coupled to said AND plane; and
activating means for activating at least one of said plurality of product term lines selectively, said activating means including a switch connected between each of selected ones of said plurality of product term lines and said OR plane and electing means for supplying a selection signal to each of said switches.

2. The device of claim 1, wherein said selection signal has two states, said switch is closed when said selection signal has a first state and said switch is opened when said selection signal has a second state which is different from said first state.

3. The device of claim 2, wherein said plurality of product term lines are divided into groups and said selection signal having the same state is supplied to the switches of the same group.

4. The device of claim 2, wherein said switch is a MOS transistor.

5. A programmable logic device, comprising:
an AND plane, including a plurality of input lines, a plurality of product term lines, and a plurality of programmable elements each disposed at an intersection of a respective input line and a respective product term line;
an OR plane operatively coupled to said AND plane; and
activating means for selectively activating one or more selected subsets of said product term lines, said activating means comprising a respective OR-circuit for each of said subsets, each OR-circuit having inputs connected to a respective one of said subsets of product term lines and an output and further having an activation input, and a source of subset selection signals and means for selectively applying said subset selection signals to said OR-circuits to thereby selectively activate one or more of said subsets of product term lines.

6. A programmable logic device as in claim 5 in which said OR-circuits are interposed between said AND plane and said OR plane and said outputs of said OR-circuits are connected to said OR plane.

7. A programmable logic device as in claim 5 including an AND sense circuit which is connected between each of said product term lines and said OR-circuits and has an activation input connected to a respective one of said subset selection signals to be selectively activated thereby.

8. A programmable logic device as in claim 6 in which said product term lines include a subset which is not selectively activated.

9. A programmable logic device as in claim 8 in which each of said subsets of product term lines comprises four product term lines.

* * * * *